(12) United States Patent
Im (10) Patent No.: US 8,125,839 B2
(45) Date of Patent: Feb. 28, 2012

(54) MEMORY DEVICE AND METHOD REDUCING FLUCTUATION OF READ VOLTAGE GENERATED DURING READ WHILE WRITE OPERATION

(75) Inventor: Jae-woo Im, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 836 days.

(21) Appl. No.: 12/222,635

(22) Filed: Aug. 13, 2008

(65) Prior Publication Data

US 2009/0052253 A1    Feb. 26, 2009

(30) Foreign Application Priority Data

Aug. 23, 2007   (KR) .................. 10-2007-0085004

(51) Int. Cl.
*G11C 8/00*          (2006.01)
(52) U.S. Cl. .......... 365/189.09; 365/230.03; 365/230.09
(58) Field of Classification Search ............. 365/189.09, 365/189.15, 189.16, 189.14, 230.06, 230.05, 365/230.09, 189.19, 230.03
See application file for complete search history.

(56) References Cited

U.S. PATENT DOCUMENTS

| | | | |
|---|---|---|---|
| 2003/0193825 A1* | 10/2003 | Nagasue | 365/185.03 |
| 2006/0215447 A1 | 9/2006 | Hsieh et al. | |
| 2006/0239108 A1 | 10/2006 | Shimizu et al. | |
| 2007/0217253 A1* | 9/2007 | Kim et al. | 365/163 |
| 2008/0205137 A1* | 8/2008 | Yanagidaira et al. | 365/185.03 |

FOREIGN PATENT DOCUMENTS

| KR | 10-2002-0089588 | 11/2002 |
|---|---|---|
| KR | 10-2003-0009101 | 1/2003 |

* cited by examiner

*Primary Examiner* — Richard Elms
*Assistant Examiner* — Hien Nguyen
(74) *Attorney, Agent, or Firm* — Harness, Dickey & Pierce, P.L.C.

(57) ABSTRACT

According to example embodiments, a semiconductor memory device may include a write voltage generator configured to generate a write voltage to perform the write operation to at least one of a plurality of banks where the write voltage generator generates the write voltage to have a voltage level of a read voltage before the write operation changes to a read operation. The semiconductor device may also include a read voltage generator configured to generate a read voltage to perform the read operation to at least one of the other plurality of banks and/or a plurality of switches configured to switch a voltage applied to at least one of the banks to one of the write voltage and the read voltage in response to a plurality of control signals.

20 Claims, 8 Drawing Sheets

MEMORY DEVICE AND METHOD REDUCING FLUCTUATION OF READ VOLTAGE GENERATED DURING READ WHILE WRITE OPERATION

PRIORITY STATEMENT

This application claims the benefit of Korean Patent Application No. 10-2007-0085004, filed on Aug. 23, 2007, in the Korean Intellectual Property Office, the disclosure of which is incorporated herein in its entirety by reference.

BACKGROUND

1. Field

Example embodiments relate to a semiconductor memory device, and more particularly to, a NOR flash memory device for reducing a fluctuation of a read voltage generated during a read while write (RWW) operation.

2. Description of the Related Art

Flash memories may be generally used as nonvolatile memory devices for electrically deleting or recording data and may need less power consumption than magnetic disc memory based storage media, which may have relatively fast access times comparable to hard discs.

Flash memory may be classified into one of NOR type flash memory and NAND type flash memory according to a connection of cells and bit lines. NOR type flash memory may have one bit line and two or more cell transistors connected in parallel, may store data using a channel hot electron method, and may erase data using a Fowler-Nordheim (F-N) tunneling method. NAND type flash memory may have one bit line and two or more cell transistors connected in series and may store and erase data using the F-N tunneling method. Although NOR type flash memory may be disadvantageous in highly integrated devices due to a relatively large amount of current consumption, NOR type flash memory may be advantageous to a high speed operation. Meanwhile, since NAND type flash memory may use less cell current than NOR type flash memory, NAND type flash memory may be advantageous to high integration.

Figure 1A:
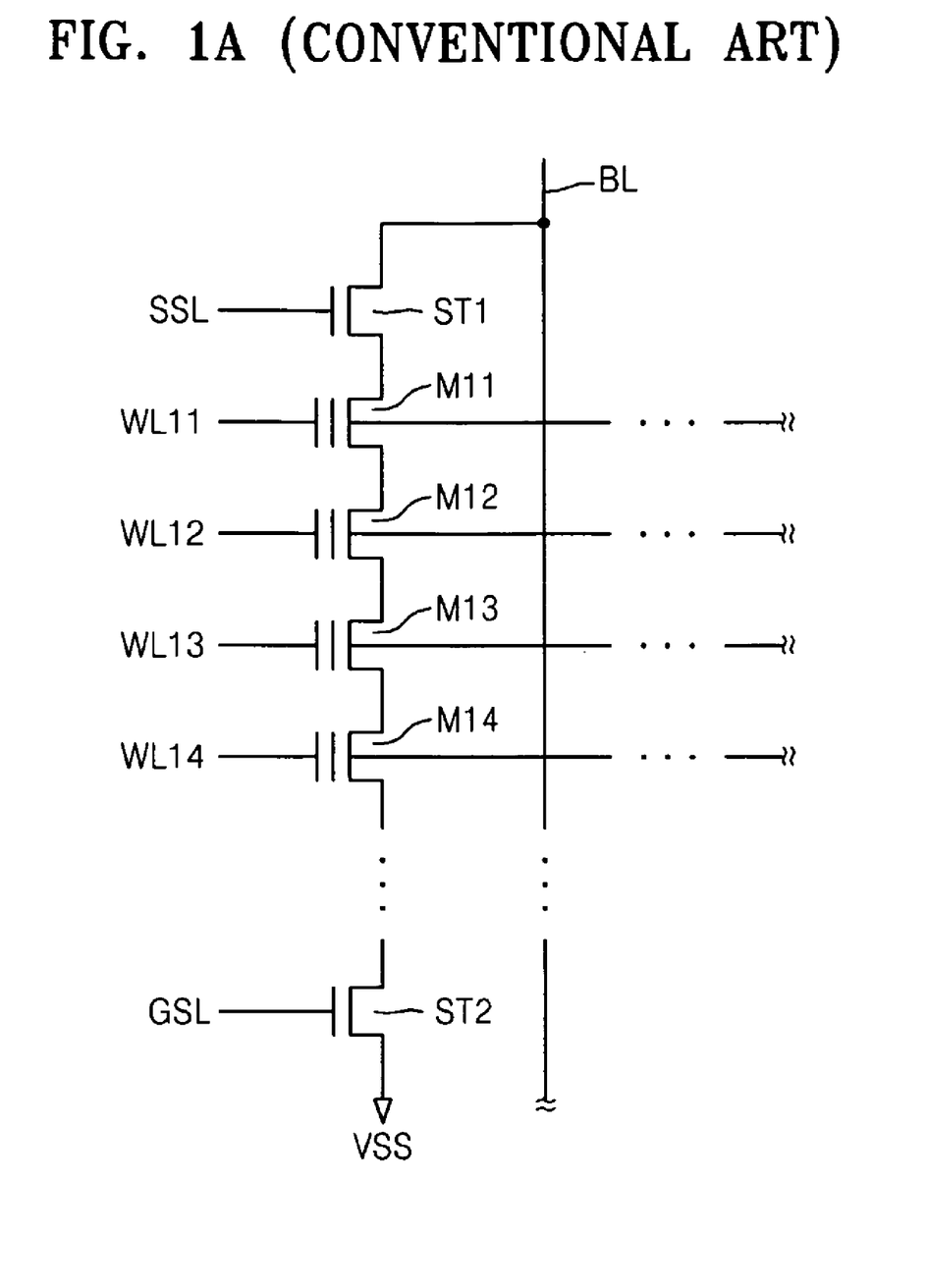
FIG. 1A is a circuit diagram of memory cells included in a conventional NAND type flash memory.

FIG. 1A is a circuit diagram of memory cells included in a conventional NAND type flash memory. Referring to FIG. 1A, a conventional NAND type flash memory includes a plurality of word lines WL11-WL14, a plurality of memory cells M11-M14 that form a string structure with selective transistors ST1 and ST2 and that are connected to a bit line BL and a ground voltage VSS in series. Since the conventional NAND type flash memory uses a relatively small amount of cell current, a NAND type nonvolatile semiconductor memory device may perform a program with regard to all memory cells connected to one word line during one program operation.

Figure 1B:
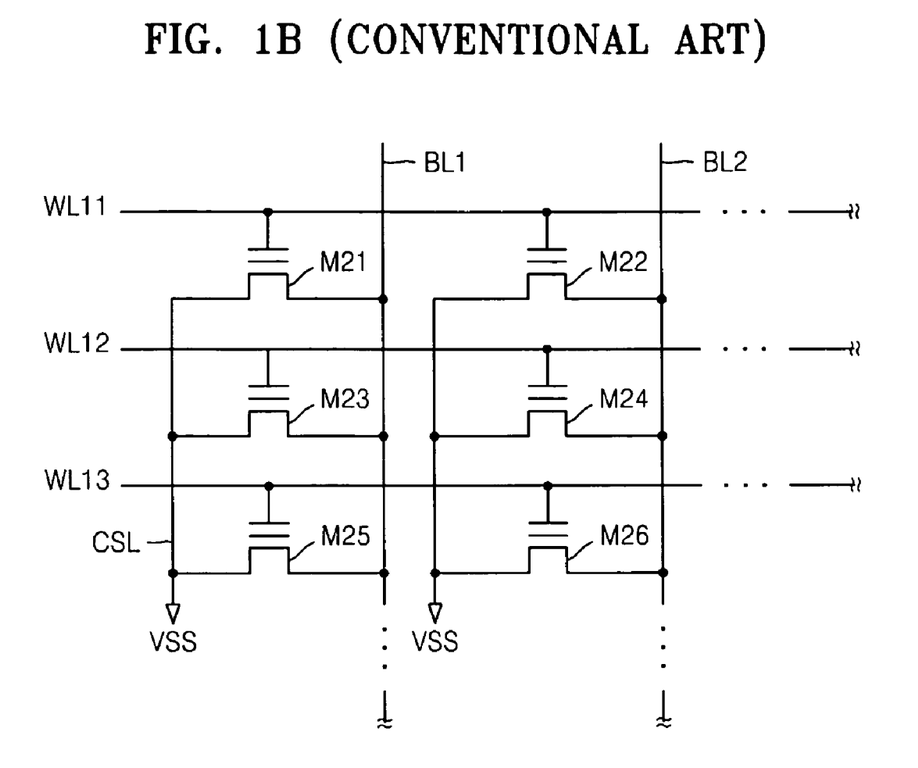
FIG. 1B is a circuit diagram of memory cells included in a conventional NOR type flash memory.

FIG. 1B is a circuit diagram of memory cells included in a conventional NOR type flash memory. Referring to FIG. 1B, each of memory cells M21 through M26 are connected to bit lines BL1 and BL2 and a source line CSL in a NOR type nonvolatile semiconductor memory device. Since the conventional NOR type flash memory needs a relatively large amount of current consumption during a program operation, the NOR type flash memory may perform a program with regard to a specific number of memory cells during one program operation.

Figure 2A:
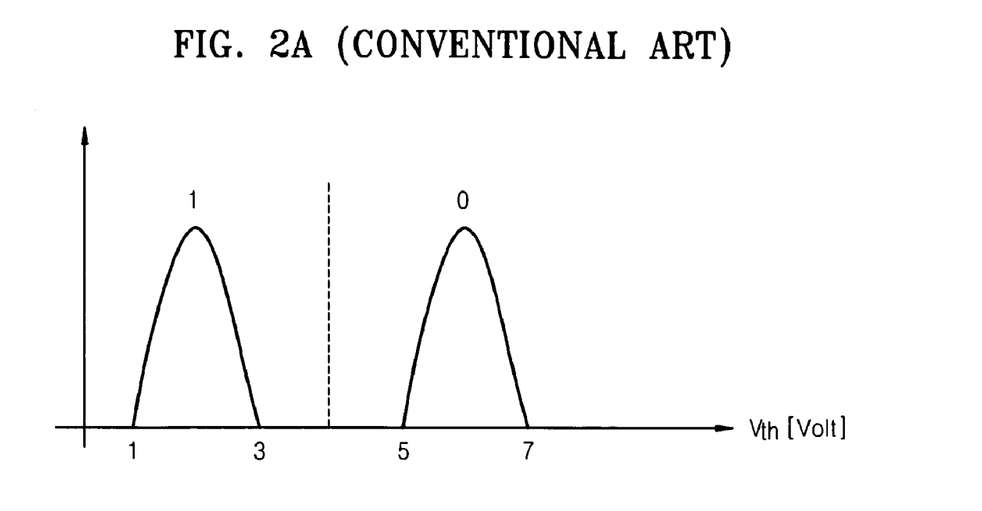
FIG. 2A is a graph illustrating a cell threshold voltage versus storage data when a flash memory device has a single level memory cell.
Figure 2B:
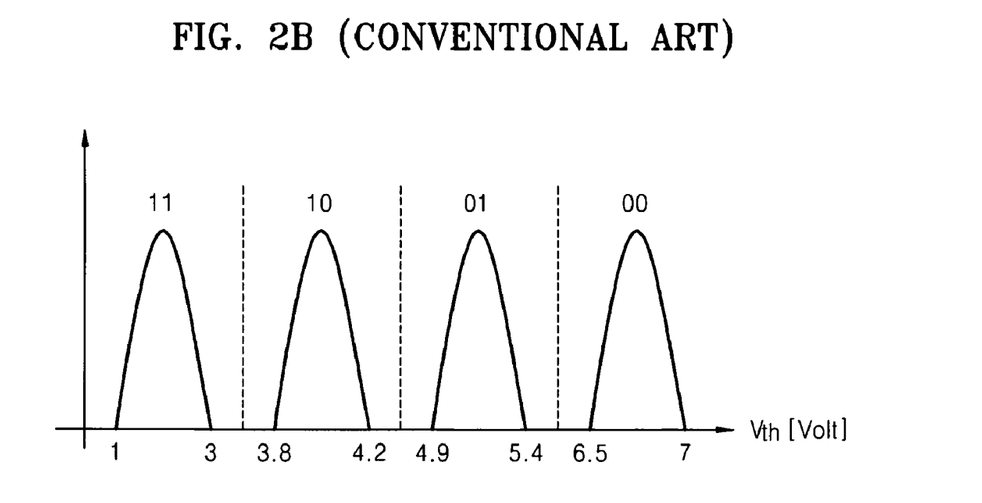
FIG. 2B is a graph illustrating a cell threshold voltage versus storage data when a flash memory device has a multi level memory cell.

FIG. 2A is a graph illustrating a cell threshold voltage versus storage data when a flash memory device has a single level memory cell. FIG. 2B is a graph illustrating a cell threshold voltage versus storage data when a flash memory device has a multi level memory cell.

Referring to FIG. 2A, one bit data may be stored at two different threshold voltages when programmed in the single level memory cell. For example, when a threshold voltage between 1 to 3 volts (V) is programmed in the single level memory cell is, data logic "1" may be stored in the single level memory cell. When a threshold voltage between 5 to 7 volts is programmed in the single level memory cell, data logic "0" may be stored in the single level memory cell.

Referring to FIG. 2B, two bit data may be stored at four different threshold voltages when programmed in the multi level memory cell. For example, when a threshold voltage between 1 to 3 volts is programmed in the multi level memory cell, data logic "11" may be stored in the multi level memory cell. When a threshold voltage between 3.8 to 4.2 volts is programmed in the multi level memory cell, data logic "10" may be stored in the multi level memory cell. When a threshold voltage between 4.9 to 5.4 volts is programmed in the multi level memory cell, data logic "01" may be stored in the multi level memory cell. When a threshold voltage between 6.5 to 7.0 volts is programmed in the multi level memory cell, data logic "00" may be stored in the multi level memory cell.

Data stored in a single or multi level memory cell may be identified according to a difference in a cell current during a data read operation. The types of flash memories and operations thereof described above are well known to one of ordinary skill in the art and thus a detailed description has been omitted.

Hereinafter, a fluctuation of a read voltage according to a read while write function of a NOR type flash memory will now be described.

The NOR type flash memory may include a plurality of banks, with each bank including a plurality of nonvolatile memory cells. Each bank may share a data line for inputting and outputting data.

The NOR type flash memory may perform an erasure operation by sectors, and perform a program operation by a word or N words having consecutive addresses existing in one sector, where N is a real number.

To perform the program operation, the NOR type flash memory may receive a program instruction, receive a program address and program data to be programmed, temporarily store the program address and the program data in a buffer, select a memory cell corresponding to the program address, and apply a program voltage (or a write voltage) corresponding to the program data to the selected memory cell.

However, it is preferable that a NOR type flash memory for storing a code reduce the time delay period during a read operation.

Therefore, a method of generating and maintaining a voltage applied to a word line of a cell during a read operation in a standby status may be used to realize the above operation characteristic. In the standby status, a power voltage may be applied to a decoder of a flash memory. As a result, if a read instruction is applied to a NOR flash memory device, it may be possible to instantly perform a read operation without an operation delay time for generating a high read voltage.

However, operations of a NOR flash memory may be divided into a write operation for programming data and a read operation for reading the programmed data. It generally takes much longer time to perform the write operation than the read operation. For example, several tens of nanoseconds (ns) may be needed for the read operation, whereas several tens or hundreds of milliseconds (ms) may be needed for the write operation.

In order to reduce or prevent deterioration of overall performance of a NOR flash memory device due to the write operation being generally longer than the read operation, the NOR flash memory device may include an array having a plurality of banks and perform the write operation in one bank while performing the read operation in another of the banks, which may be commonly referred to as read while write (RWW).

Since a write voltage used to perform the write operation may differ from a read voltage used to perform the read operation, the NOR flash memory device may change the voltage applied to the decoder from the read voltage to the write voltage during the write operation and then perform the write operation. On the other hand, if the write operation precedes the read operation, the NOR flash memory device may change a voltage applied to the decoder from the write voltage to the read voltage to prepare for the instant read operation, in a manner similar to that described above.

Therefore, electrons may instantly move in order to fill in a capacitance existing in the decoder of an array where the write operation has completed and the read voltage follows. However, the read voltage may not remain constant and thus may drop.

Figure 3:
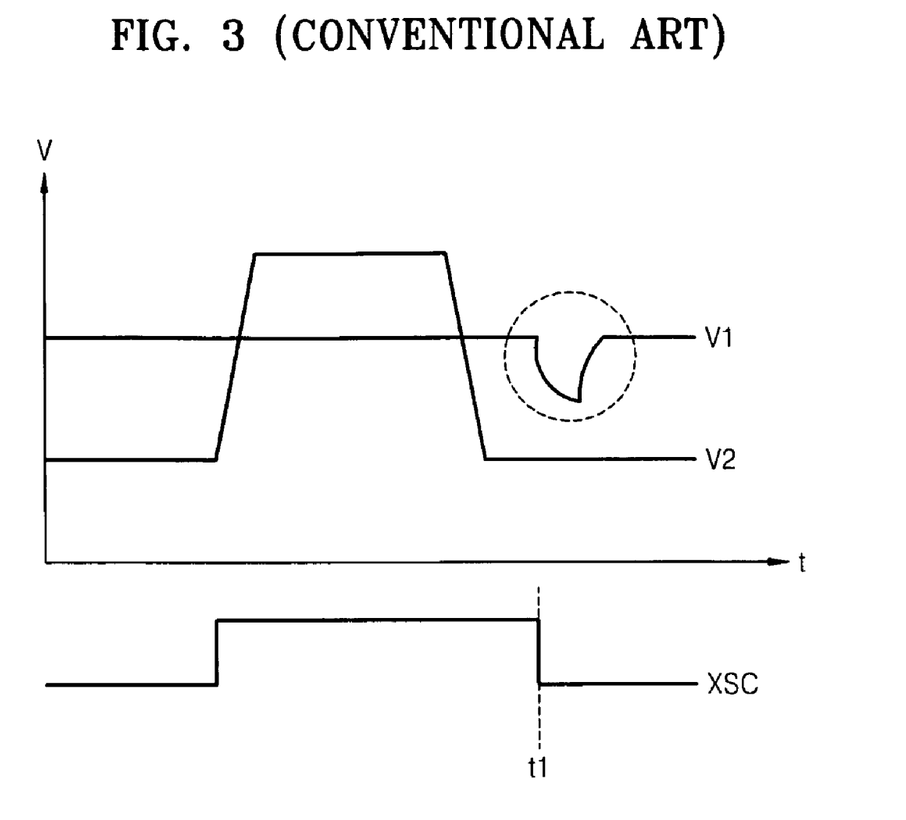
FIG. 3 is a graph illustrating a fluctuation of a read voltage according to a RWW function of a conventional NOR flash memory device.

FIG. 3 is a graph illustrating a fluctuation of a read voltage according to a RWW function of a conventional NOR flash memory device. In FIG. 3 Is shown a read voltage V1, a write voltage V2 and a control signal XSC. Referring to FIG. 3, the read voltage V1 drops (a circular dot line) at a point t1 where a write operation is changed to a read operation in response to the control signal XSC.

To address this problem, a size of an array, where a voltage is switched during the write operation, may be reduced, thereby reducing a voltage drop when the voltage is switched to the read voltage after the write operation is finished. However, it may be necessary to further reduce the fluctuation of the read voltage irrespective of the size of the array.

SUMMARY

Example embodiments provide a NOR flash memory device for reducing a fluctuation of a read voltage according to a read while write (RWW) function irrespective of the size of an array of a NOR flash memory.

Example embodiments also provide a method of reducing a fluctuation of a read voltage according to a RWW function irrespective of the size of an array of a NOR flash memory.

According to example embodiments, a semiconductor memory device may include a write voltage generator configured to generate a write voltage to perform the write operation to at least one of a plurality of banks where the write voltage generator generates the write voltage to have a voltage level of a read voltage before the write operation changes to a read operation.

Example embodiments may also include a read voltage generator and a plurality of switches. The read voltage generator may be configured to generate the read voltage to perform the read operation to at least one of the other plurality of banks. The plurality of switches may be configured to switch a voltage applied to at least one of the plurality of banks to one of the write voltage and the read voltage in response to a plurality of control signals.

In example embodiments, at least one of the plurality of switches may switch the write voltage to the read voltage in response to at least one of the plurality of control signals if the voltage level of the write voltage is the same as that of the read voltage.

The write voltage generator may level-down the write voltage to a first voltage level and level-up the first voltage level to the voltage level of the read voltage. The write voltage generator may also level-down the write voltage to the voltage level of the read voltage.

Each of the switches may be included in a corresponding bank. In addition, each of the banks may include a plurality of sectors. Each of the switches may be included in a corresponding sector.

Each of the switches may be included in each of the sectors. Each of the switches may be included in at least two or more sectors. Each of the switches may be included in each of the banks.

Each of the switches may include a decoder configured to output one of the write voltage and the read voltage in response to at least one of the plurality of control signals.

Each of the switches may apply the read voltage to the banks in a standby mode.

Example embodiments may also include a control signal generator configured to generate the plurality of control signals.

In example embodiments, the semiconductor memory device may be a NOR flash memory device.

According to example embodiments, a method of reducing a fluctuation of a read voltage may include applying a write voltage to corresponding banks in a memory device during a write operation, generating the write voltage to have a voltage level of a read voltage before the write operation changes to a read operation for the corresponding banks, and/or applying the write voltage having the voltage level of the read voltage to the corresponding banks.

Example embodiments may also include switching a voltage applied to the corresponding banks from the write voltage to the read voltage if the voltage level of the write voltage is the same as that of the read voltage.

The generating may include leveling-down the write voltage to a first voltage level and leveling-up the first voltage level to the voltage level of the read voltage.

The generating may include leveling-down the write voltage to the voltage level of the read voltage.

Example embodiments may also include applying one of the write voltage and the read voltage to at least one a plurality of sectors, where each of the banks includes the plurality of sectors.

BRIEF DESCRIPTION

The above and other features and advantages will become more apparent by describing in detail example embodiments thereof with reference to the attached drawings in which.

DETAILED DESCRIPTION

Example embodiments will now be described more fully with reference to the accompanying drawings. In the drawings, the thicknesses of layers and regions may be exaggerated for clarity. Specific structural and functional details disclosed herein are merely representative for purposes of describing example embodiments. Example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 4:
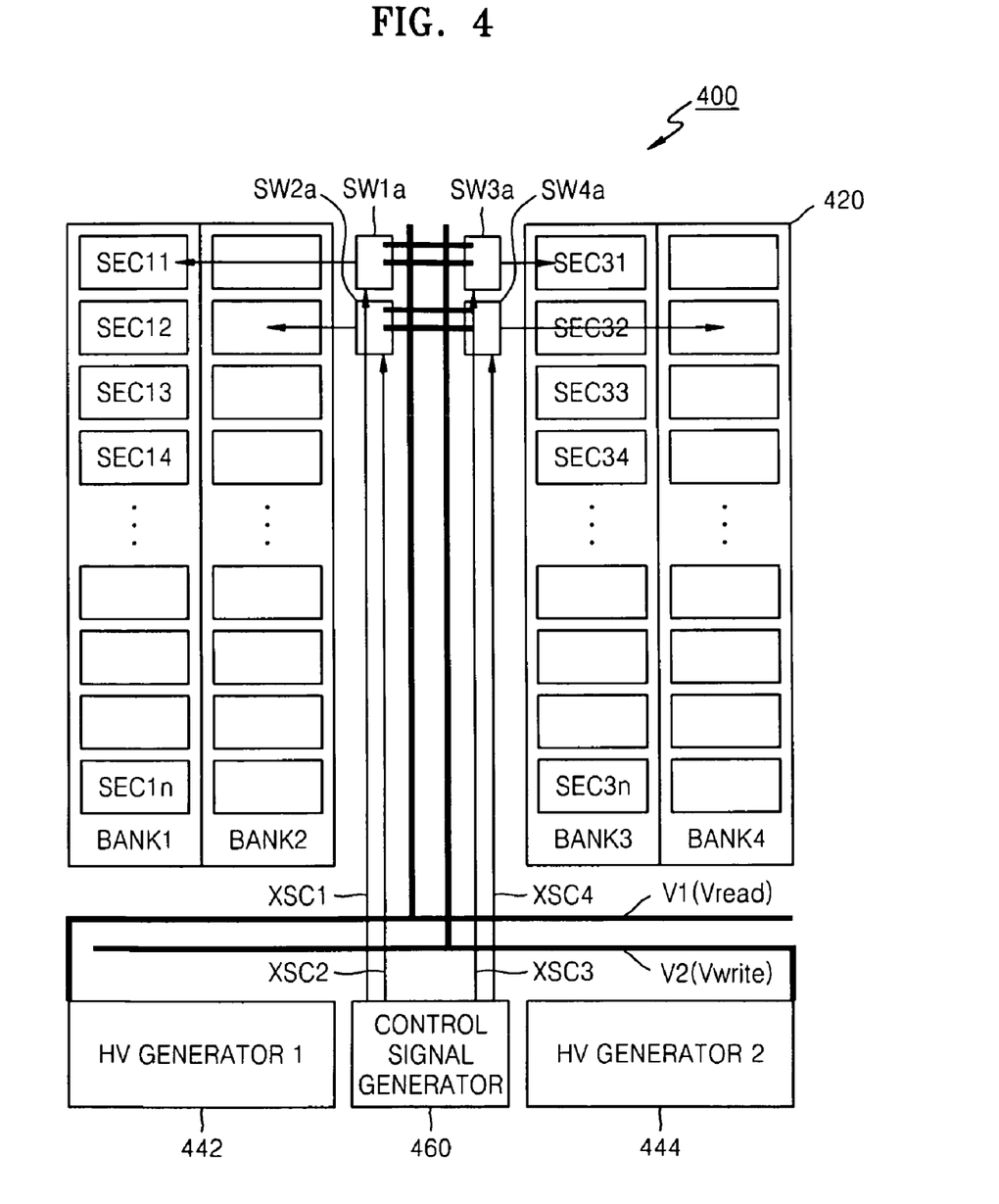
FIG. 4 is a block diagram of a NOR flash memory device, according to example embodiments.

FIG. 4 is a block diagram of a semiconductor memory device 400 according to example embodiments. Referring to FIG. 4, the semiconductor memory device 400 includes a memory cell array 420, a read voltage generator 442, a write voltage generator 444, and switches SW1$a$ through SW4$a$. The semiconductor memory device 400 may perform a read while write (RWW) function.

The memory cell array 420 includes a plurality of banks BANK1 through BANK4. Since the semiconductor memory device 400 performs the RWW function, it may, for example, perform a read operation with regard to any of the $2^{nd}$ bank BANK2 through the $4^{th}$ bank BANK4 during a write operation with regard to the $1^{st}$ bank BANK1. Each of banks BANK1 through BANK4 may include a plurality of sectors SEC.

A plurality of switches SW1$a$ through SW4$a$ may establish a voltage (shown as an arrow connecting a switch and a sector) applied to a corresponding sector at one of a write voltage V2 and a read voltage V1 in response to a plurality of control signals XSC1 through XSC4. In more detail, the switches SW1$a$ through SW4$a$ may apply the write voltage V2 to corresponding sectors during the write operation and apply the read voltage V1 to corresponding sectors during the read operation. However, the read voltage V1 may also be applied to banks in a standby mode.

Each of the sectors SEC of the semiconductor memory device 400 may include each of the switches SW1$a$ through SW4$a$. For example, the switch 1$a$ SW1$a$ may apply a voltage to the $1^{st}$ sector SEC11 of the $1^{st}$ bank BANK1. Likewise, the switch 3$a$ SW3$a$ may apply the voltage to the $3^{rd}$ sector SEC31 of the $3^{rd}$ bank BANK3. Although not shown, another switch with regard to the $1^{st}$ bank BANK1 may apply the voltage to the $2^{nd}$ sector SEC12 of the $1^{st}$ bank BANK1, and another switch with regard to the $3^{rd}$ bank BANK3 may apply the voltage to the $2^{nd}$ sector SEC32 of the $3^{rd}$ bank BANK3.

Each of the switches SW1$a$ through SW4$a$ may switch between the read voltage V1 and the write voltage V2 in response to the corresponding control signals XSC1 through XSC4. For example, the switch 1$a$ SW1$a$ may operate in response to the $1^{st}$ control signal XSC1, and the switch 3$a$ SW3$a$ may operate in response to the $3^{rd}$ control signal XSC3. The semiconductor memory device 400 may further include a control signal generator 460 for generating the control signals XSC1 through XSC4. Each of the switches SW1$a$ through SW4$a$ may further include a decoder (not shown) for outputting one of the write voltage V2 and the read voltage V1 in response to the corresponding control signals XSC1 through XSC4.

An operation of applying a voltage to the $2^{nd}$ bank BANK2 and the $4^{th}$ bank BANK4 may be the same as that of applying the voltage to the $1^{st}$ bank BANK1 and the $3^{rd}$ bank BANK3. Hereinafter, an operation of applying a voltage to one bank may be applied in a similar manner to other banks.

Figure 5:
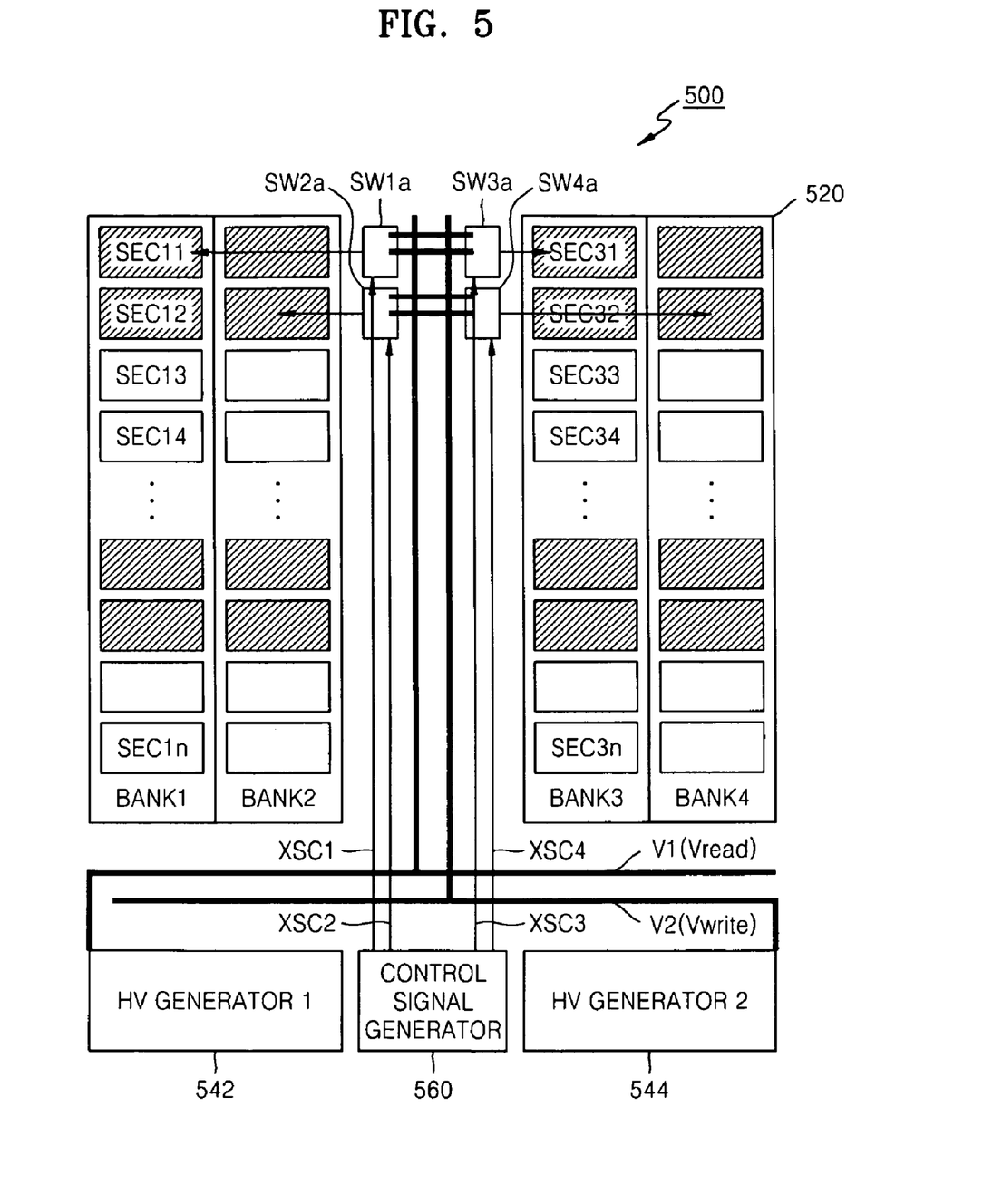
FIG. 5 is another block diagram of a NOR flash memory device, according to example embodiments.

FIG. 5 is a block diagram of a NOR flash memory device, according to example embodiments. Each of the switches SW1a through SW4a may be included in two or more sectors, as shown in FIG. 5. Referring to FIG. 5, another switch with regard to a $1^{st}$ bank BANK1 may apply a voltage to a $3^{rd}$ sector SEC13 and a $4^{th}$ sector SEC14 of the $1^{st}$ bank BANK1, and another switch with regard to a $3^{rd}$ bank BANK3 may apply the voltage to a $3^{rd}$ sector SEC33 and a $4^{th}$ sector SEC34 of the $3^{rd}$ bank BANK3.

Figure 6:
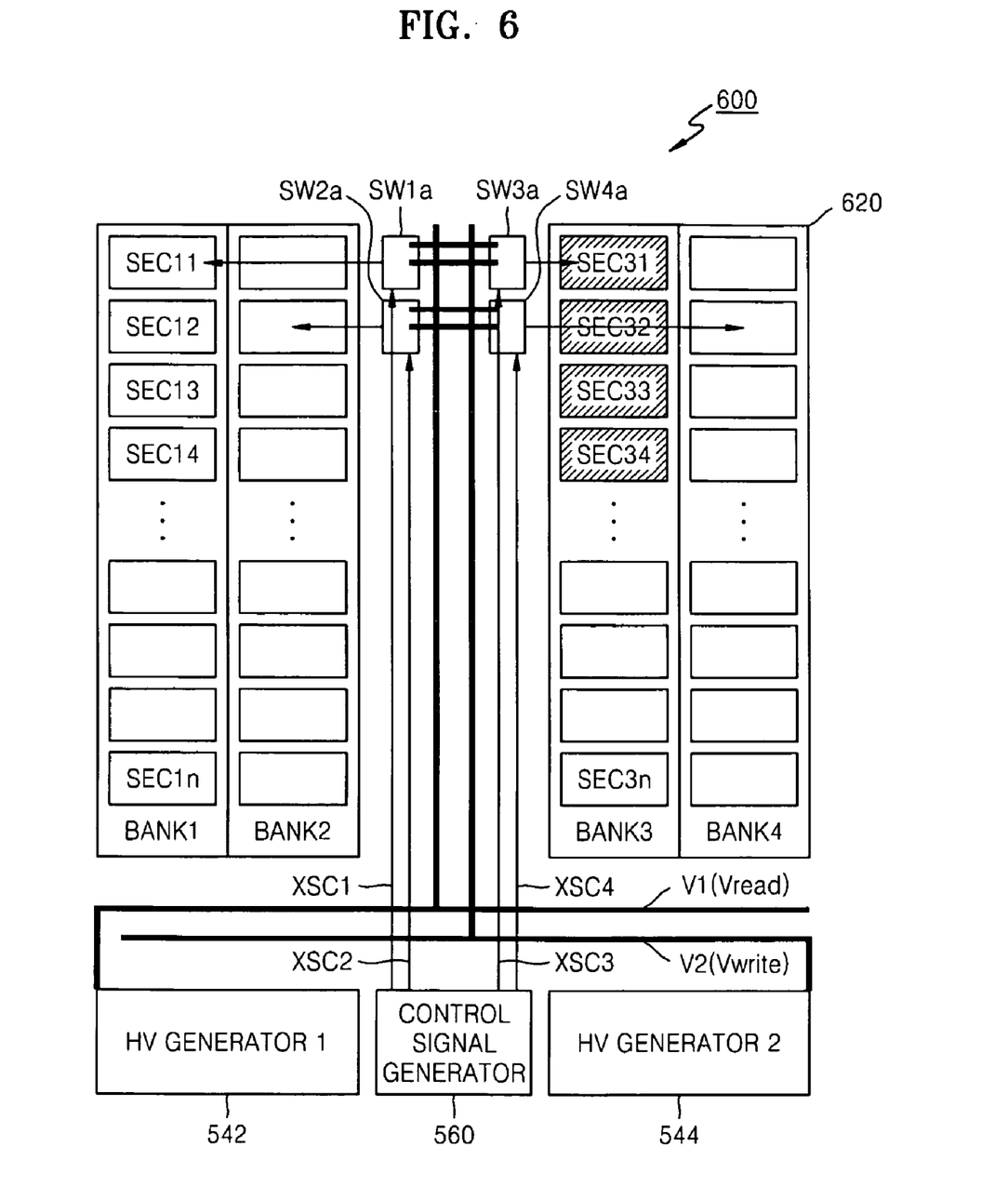
FIG. 6 is another block diagram of a NOR flash memory device, according to example embodiments.

FIG. 6 is another block diagram of a NOR flash memory device, according to example embodiments. Each of the switches SW1a through SW4a may be included in a sector, or two or more sectors, as shown in FIG. 6. Referring to FIG. 6, a switch 1a SW1a may apply a voltage to a $1^{st}$ sector SEC11 of a $1^{st}$ bank BANK1. However, a switch 3a SW3a may apply a voltage to a $1^{st}$ sector SEC31 though a $4^{th}$ sector SEC34 of a $3^{rd}$ bank BANK3.

Referring to FIG. 4, the read voltage generator 442 may generate the read voltage V1 used to perform a read operation from the banks BANK1 through BANK4. The write voltage generator 444 may generate the write voltage V2 used to perform a write operation with regard to the banks BANK1 through BANK4.

However, the write voltage generator 444 may generate the write voltage V2 having the same voltage level as the read voltage V1 before the write operation is changed to the read operation.

Figure 7A:
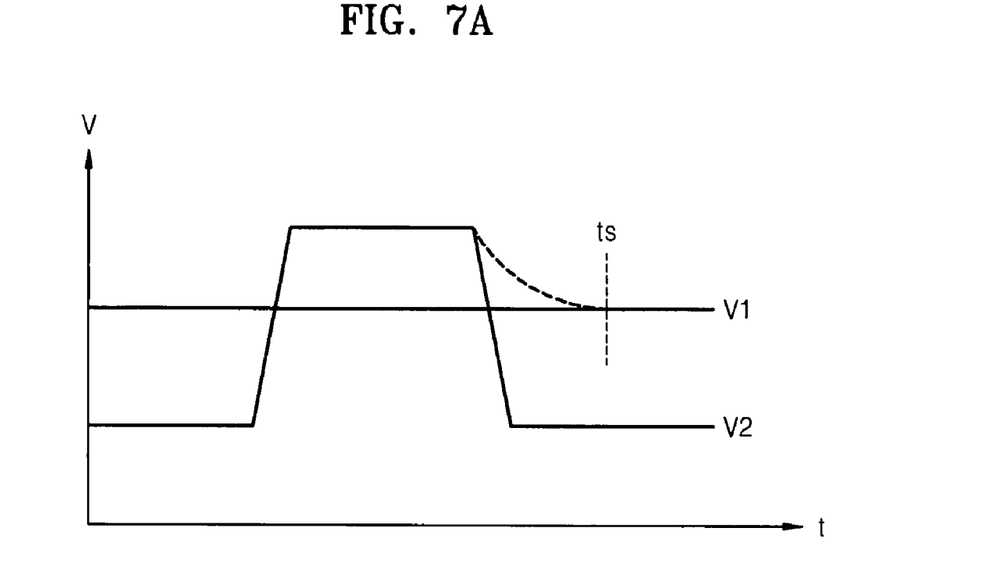
FIG. 7A is a graph illustrating a method of reducing a fluctuation of a read voltage according to a read while write (RWW) function of the NOR flash memory device shown in FIGS. 4 through 6, according to example embodiments.
Figure 7B:
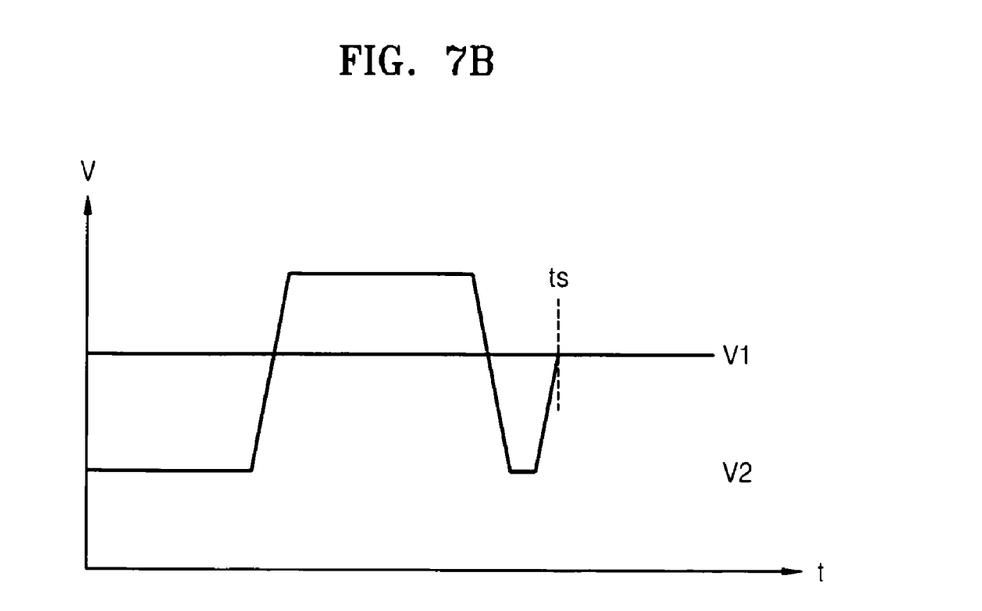
FIG. 7B is another graph illustrating a method of reducing the fluctuation of the read voltage according to the RWW function of the NOR flash memory device shown in FIGS. 4 through 6, according to example embodiments.

FIG. 7A is a graph illustrating a method of reducing a fluctuation of a read voltage according to a RWW function of the NOR flash memory device shown in FIGS. 4 through 6 according to example embodiments. FIG. 7B is another graph illustrating a method of reducing the fluctuation of the read voltage according to the RWW function of the NOR flash memory device shown in FIGS. 4 through 6 according to example embodiments.

Referring to FIGS. 4 and 7A, the write voltage generator 444 may level-down (shown as a dotted line) the write voltage V2 to a voltage level of the read voltage V1 so that a voltage level of the write voltage V2 may be identical to the voltage level of the read voltage V1 before the write operation is changed to the read operation.

Referring to FIGS. 4 and 7B, the write voltage generator 444 may level-down the write voltage V2 to a first voltage level and level-up the write voltage V2 to the voltage level of the read voltage V1 so that the voltage level of the write voltage V2 may be identical to the voltage level of the read voltage V1 before the write operation is changed to the read operation.

Referring to FIGS. 4, 7A, and 7B, if the voltage levels of the write voltage V2 and the read voltage V1 are identical to each other (as shown at ts), each of the switches SW1a through SW4a may switch a voltage applied to a corresponding sector from the write voltage V2 to the read voltage V1 in response to the corresponding control signals XSC1 through XSC4.

The semiconductor memory device, according to example embodiments, may apply a voltage having the same level as read voltage V1 to a corresponding bank using the write voltage V2 before a write operation is changed to a read operation, thereby reducing the fluctuation of the read voltage according to the RWW function.

Although the semiconductor memory device illustrated in FIG. 4 may be used to reduce the fluctuation of the read voltage according to the RWW function, the semiconductor memory devices illustrated in FIGS. 5 and 6 may also be used in the same manner, as described above.

A semiconductor memory device, according to example embodiments, may apply a voltage having the same level as a read voltage to a corresponding bank using a write voltage before a write operation is changed to a read operation, thereby reducing a fluctuation of a read voltage according to a RWW function.

While example embodiments have been particularly shown and described, it will be understood by those of ordinary skill in the art that various changes in form and details may be made therein without departing from the spirit and scope of example embodiments as defined by the appended claims. Example embodiments should be considered in a descriptive sense only and not for purposes of limitation. Therefore, the scope of example embodiments is defined not by the detailed description but by the appended claims, and all differences within the scope will be construed as being included in example embodiments.

What is claimed is:

1. A semiconductor memory device for performing a read operation with regard to some banks among a plurality of banks while performing a write operation with regard to other banks, the semiconductor memory device, comprising:
 a write voltage generator configured to generate a write voltage to perform the write operation to at least one of the plurality of banks, wherein
 the write voltage generator generates the write voltage to have a voltage level of a read voltage before the write operation changes to the read operation.

2. The semiconductor memory device of claim 1, further comprising:
 a read voltage generator configured to generate the read voltage to perform the read operation to at least one of the other plurality of banks; and
 a plurality of switches configured to switch a voltage applied to at least one of the plurality of banks to one of the write voltage and the read voltage in response to a plurality of control signals.

3. The semiconductor memory device of claim 2, wherein at least one of the plurality of switches switch the write voltage to the read voltage in response to at least one of the plurality of control signals if the voltage level of the write voltage is the same as that of the read voltage.

4. The semiconductor memory device of claim 1, wherein the write voltage generator level-downs the write voltage to a first voltage level and level-ups the first voltage level to the voltage level of the read voltage.

5. The semiconductor memory device of claim 3, wherein the write voltage generator level-downs the write voltage to the voltage level of the read voltage.

6. The semiconductor memory device of claim 2, wherein each of the switches is included in a corresponding bank.

7. The semiconductor memory device of claim 6, wherein each of the banks includes a plurality of sectors.

8. The semiconductor memory device of claim 7, wherein each of the switches is included in a corresponding sector.

9. The semiconductor memory device of claim 7, wherein each of the switches is included in each of the sectors.

10. The semiconductor memory device of claim 7, wherein each of the switches is included in at least two or more sectors.

11. The semiconductor memory device of claim 6, wherein each of the switches is included in each bank.

12. The semiconductor memory device of claim 2, wherein each of the switches includes a decoder configured to output one of the write voltage and the read voltage in response to at least one of the plurality of control signals.

13. The semiconductor memory device of claim 2, wherein each of the switches applies the read voltage to the banks in a standby mode.

14. The semiconductor memory device of claim 1, further comprising: a control signal generator configured to generate the plurality of control signals.

15. The semiconductor memory device of claim 1, wherein the semiconductor memory device is a NOR flash memory device.

16. A method of reducing a fluctuation of a read voltage during a read while write operation, comprising:
applying a write voltage to corresponding banks in a memory device during a write operation;
generating the write voltage to have a voltage level of a read voltage before the write operation changes to a read operation for the corresponding banks; and
applying the write voltage having the voltage level of the read voltage to the corresponding banks.

17. The method of claim 16, further comprising:
switching a voltage applied to the corresponding banks from the write voltage to the read voltage if the voltage level of the write voltage is the same as that of the read voltage.

18. The method of claim 16, wherein the generating includes leveling-down the write voltage to a first voltage level and leveling-up the first voltage level to the voltage level of the read voltage.

19. The method of claim 18, wherein the generating includes leveling-down the write voltage to the voltage level of the read voltage.

20. The method of claim 16, wherein further comprising: applying one of the write voltage and the read voltage to at least one a plurality of sectors, where each of the banks includes the plurality of sectors.

* * * * *